(12) United States Patent
    Kim et al.

(10) Patent No.: US 12,302,556 B2
(45) Date of Patent: May 13, 2025

(54) SEMICONDUCTOR DEVICE AND METHOD OF FABRICATING THE SAME

(71) Applicant: Samsung Electronics Co., Ltd., Suwon-si (KR)

(72) Inventors: Dong-Wan Kim, Hwaseong-si (KR); Keonhee Park, Suwon-si (KR); Dong-Sik Park, Suwon-si (KR); Joonsuk Park, Suwon-si (KR); Jihoon Chang, Yongin-si (KR); Hyeon-Woo Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 17/747,423

(22) Filed: May 18, 2022

(65) Prior Publication Data

US 2023/0039149 A1    Feb. 9, 2023

(30) Foreign Application Priority Data

Aug. 4, 2021   (KR) .................. 10-2021-0102347

(51) Int. Cl.
    *H01L 27/108*    (2006.01)
    *H01L 21/3213*   (2006.01)
    *H10B 12/00*     (2023.01)

(52) U.S. Cl.
    CPC ..... *H10B 12/485* (2023.02); *H01L 21/32139* (2013.01); *H10B 12/09* (2023.02); *H10B 12/482* (2023.02)

(58) Field of Classification Search
    CPC ......... H01L 27/10888; H01L 27/10885; H01L 27/10894; H01L 21/32139; H10B 12/09; H10B 12/0335; H10B 12/34; H10B 12/315; H10B 12/482; H10B 12/485; G11C 11/4097
    See application file for complete search history.

(56) References Cited

U.S. PATENT DOCUMENTS

| 6,977,197 B2 | 12/2005 | Park et al. |
| 8,293,603 B2 | 10/2012 | Cho et al. |
| 8,865,547 B2 | 10/2014 | Kang |

(Continued)

FOREIGN PATENT DOCUMENTS

| TW | 201830663 A | 8/2019 |
| TW | 201944548 A | 10/2020 |

*Primary Examiner* — Walter H Swanson
(74) *Attorney, Agent, or Firm* — Muir Patent Law, PLLC

(57) ABSTRACT

Disclosed are semiconductor devices and their fabrication methods. The semiconductor device comprises a substrate including a peripheral block and cell blocks each including a cell center region, a cell edge region, and a cell middle region, and bit lines extending on each cell block in a first direction. The bit lines include center bit lines, middle bit lines, and edge bit lines. The bit line has first and second lateral surfaces opposite to each other in a second direction. The first lateral surface straightly extends along the first direction on the cell center region, the cell middle region, and the cell edge region. The second lateral surface straightly extends along the first direction on the cell center region and the cell edge region, and the second lateral surface extends along a third direction, that intersects the first direction and the second direction, on the cell middle region.

15 Claims, 11 Drawing Sheets

(56) References Cited

U.S. PATENT DOCUMENTS

| | | |
|---|---|---|
| 9,287,395 B2 | 3/2016 | Jeong |
| 9,431,264 B2 | 8/2016 | Jang et al. |
| 9,780,091 B2 | 10/2017 | Basker et al. |
| 10,157,913 B2 | 12/2018 | Ramaswamy |
| 10,347,639 B1 | 7/2019 | Ujihara et al. |
| 2008/0025066 A1* | 1/2008 | Fasoli ............... G11C 8/14 365/148 |
| 2013/0256770 A1 | 10/2013 | Huh et al. |
| 2015/0380421 A1 | 12/2015 | Sim et al. |
| 2016/0336056 A1 | 11/2016 | Clark et al. |
| 2021/0035982 A1 | 2/2021 | Liu et al. |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0102347 filed on Aug. 4, 2021 in the Korean Intellectual Property Office, the disclosure of which is hereby incorporated by reference in its entirety.

BACKGROUND

The present inventive concepts relate to a semiconductor device and a method of fabricating the same, and more particularly, to a semiconductor device including bit lines that are patterned in a cell block and a method of fabricating the same.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. For satisfying the above demands, semiconductor devices have been more highly integrated. The high integration of semiconductor devices may cause a reduction in reliability of the semiconductor devices. However, the high reliability of semiconductor devices has been increasingly required with the advance in the electronic industry. Therefore, various researches have been conducted for enhancing the reliability of semiconductor devices.

SUMMARY

Some embodiments of the present inventive concepts provide a semiconductor device capable of minimizing pattern defects caused by miniaturization of the semiconductor device.

An object of the present inventive concepts is not limited to the mentioned above, and other objects which have not been mentioned above will be clearly understood to those skilled in the art from the following description.

According to some embodiments of the present inventive concepts, a semiconductor device may comprise: a substrate that includes a plurality of cell blocks and a peripheral block, each cell block including a cell center region, a cell edge region, and a cell middle region between the cell center region and the cell edge region; and a plurality of bit lines that extend along a first direction on each cell block, the first direction being parallel to a top surface of the substrate. The bit lines may include a plurality of center bit lines on the cell center region, a plurality of middle bit lines on the cell middle region, and a plurality of edge bit lines on the cell edge region. Each of the bit lines may have a first lateral surface and a second lateral surface that are opposite to each other in a second direction. The second direction may be parallel to the top surface of the substrate and intersect the first direction. The first lateral surface may straightly extend along the first direction on the cell center region, the cell middle region, and the cell edge region. The second lateral surface may straightly extend along the first direction on each of the cell center region and the cell edge region, and the second lateral surface may extend along a third direction, that intersects the first direction and the second direction, on the cell middle region.

According to some embodiments of the present inventive concepts, a method of fabricating a semiconductor device may comprise: preparing a substrate that includes a plurality of cell blocks and a peripheral block, each cell block including a cell center region, a cell edge region, and a cell middle region between the cell center region and the cell edge region; forming on the substrate a bit line layer, a bit line capping layer, a lower mask layer, a plurality of upper mask patterns, and a sacrificial layer, the upper mask patterns extending along a first direction parallel to a top surface of the substrate; forming on the sacrificial layer a plurality of photoresist patterns that cover the cell edge region and a portion of the cell middle region adjacent to the cell edge region; removing a portion of the sacrificial layer exposed by the photoresist patterns; removing the photoresist patterns; forming the sacrificial layer into a plurality of sacrificial patterns; and using the sacrificial patterns as an etching mask to etch the bit line layer to form a plurality of bit lines.

DETAILED DESCRIPTION OF EMBODIMENTS

Some embodiments of the present inventive concepts will now be described in detail with reference to the accompanying drawings to aid in clearly explaining the present inventive concepts.

Figure 1:
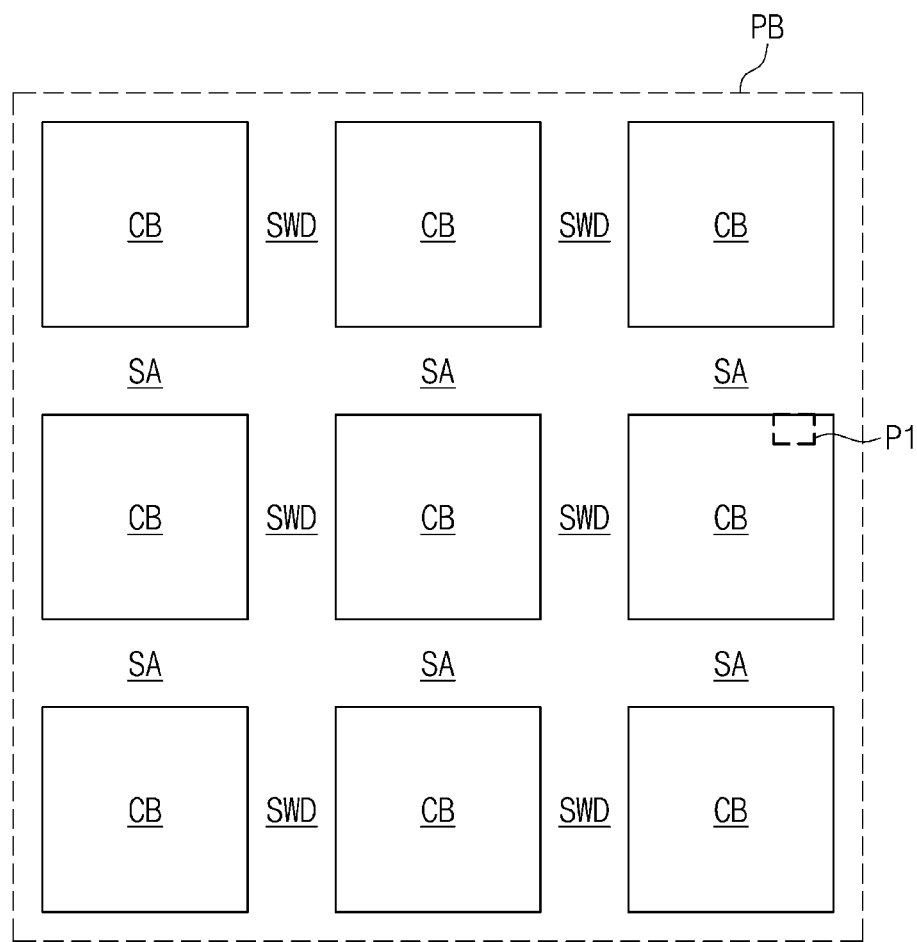
FIG. 1 illustrates a block diagram showing a semiconductor device according to some embodiments of the present inventive concepts.
Figure 2:
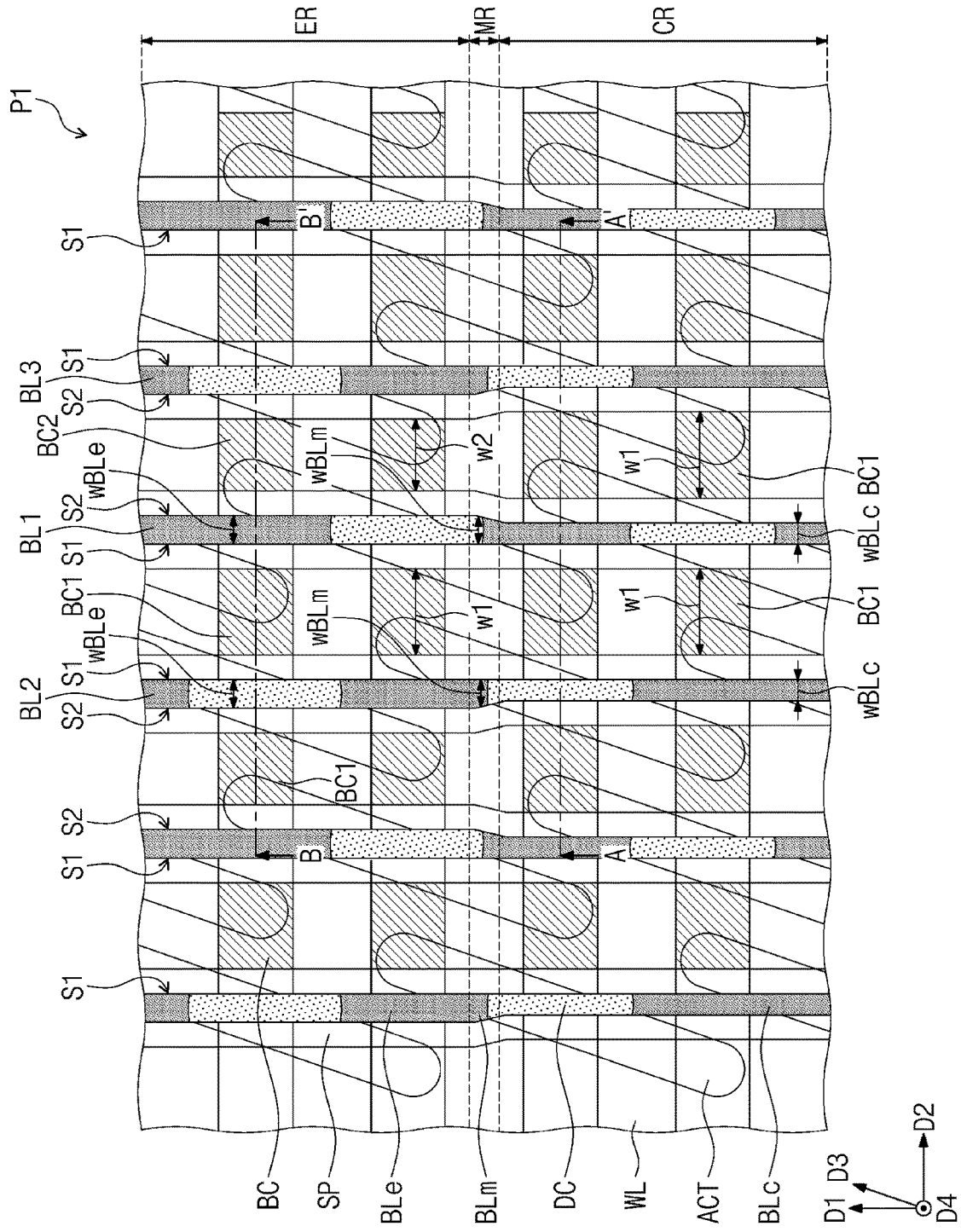
FIG. 2 illustrates a plan view of section P1 depicted in FIG. 1, showing a semiconductor device according to some embodiments of the present inventive concepts.
Figure 3:
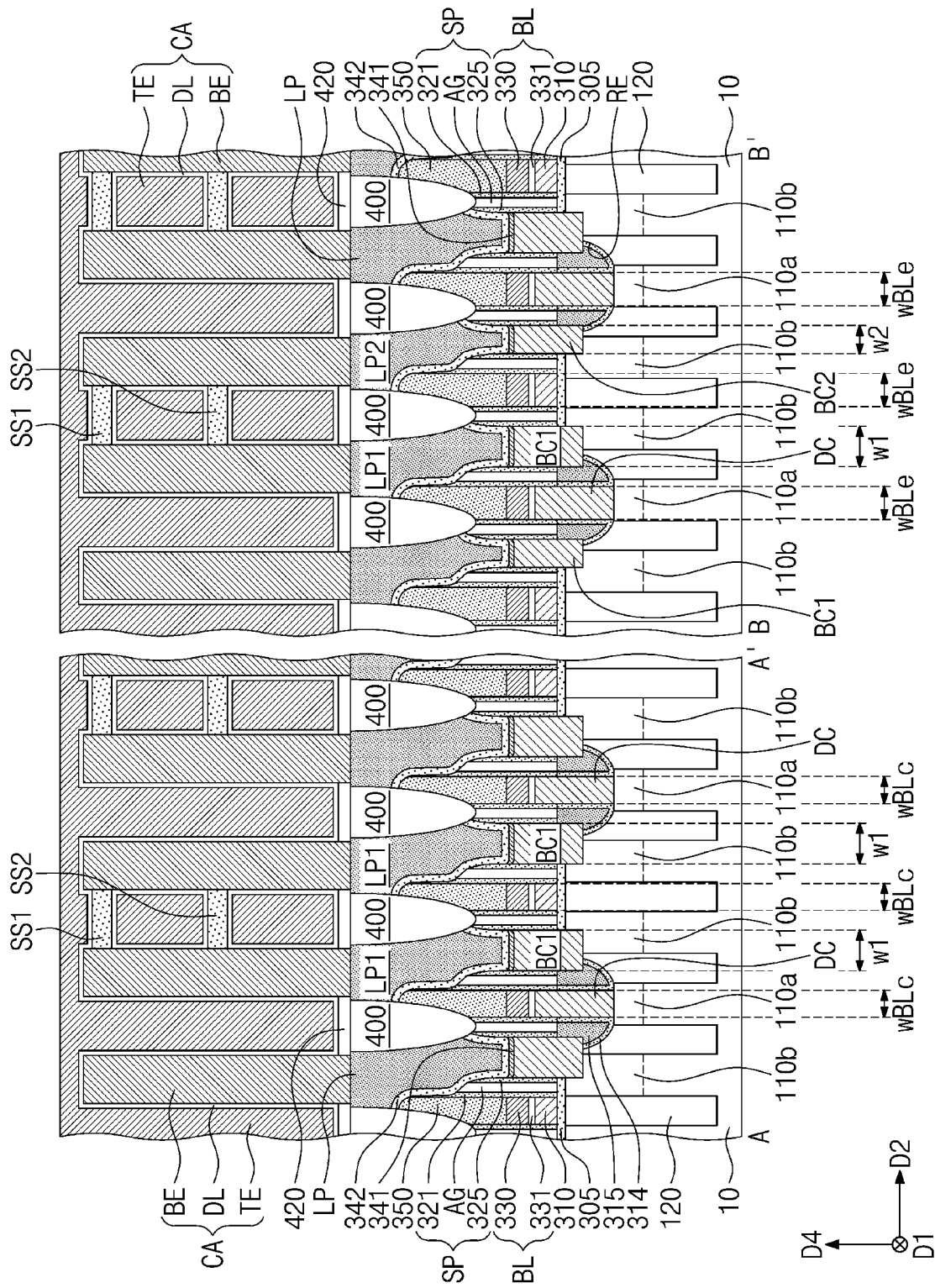
FIG. 3 illustrates a cross-sectional view taken along lines A-A' and B-B' of FIG. 2.

FIG. 1 illustrates a block diagram showing a semiconductor device according to some embodiments of the present inventive concepts. FIG. 2 illustrates a plan view of section P1 depicted in FIG. 1, showing a semiconductor device according to some embodiments of the present inventive concepts. FIG. 3 illustrates a cross-sectional view taken along lines A-A' and B-B' of FIG. 2.

Referring to FIG. 1, a semiconductor device may include cell blocks CB and a peripheral block PB that surrounds each of the cell blocks CB. The semiconductor device may be a memory device, and each of the cell blocks CB may include a cell circuit such as a memory integrated circuit. The peripheral block PB may include various peripheral circuits required for operation of the cell circuit.

The peripheral block PB may include sense amplifier circuits SA and sub-word line driver circuits SWD. For example, the sense amplifier circuits SA may face each other across the cell blocks CB, and the sub-word line driver circuits SWD may face each other across the cell blocks CB. The peripheral block PB may further include power and ground driver circuits for sense amplifier drive.

Referring to FIGS. 1 to 3, a substrate 10 may be provided which includes the cell blocks CB and the peripheral block PB. The substrate 10 may be a semiconductor substrate, such as a silicon substrate, a germanium substrate, or a silicon-germanium substrate. Each of the cell blocks CB may include a cell center region CR, a cell edge region ER, and a cell middle region MR between the cell center region CR and the cell edge region ER. The cell center region CR, the cell middle region MR, and the cell edge region ER may each constitute a separate area of the substrate 10 within each cell block CB. The cell center region CR, the cell middle region MR, and the cell edge region ER may be provided along a first direction D1 parallel to a top surface of the substrate 10. The cell middle region MR may be an area that extends along a second direction D2 that is parallel to the top surface of the substrate 10 and intersects the first direction D1.

Cell active patterns ACT may be disposed on the cell center region CR, the cell middle region MR, and the cell edge region ER. The cell active patterns ACT may be spaced apart from each other in the first direction D1 and the second direction D2. The cell active patterns ACT may each have a bar shape that is parallel to the top surface of the substrate 10 and extends in a third direction D3 intersecting the first and second directions D1 and D2. An end of one of the cell active patterns ACT may be arranged adjacent to a center of another cell active pattern ACT adjacent thereto in the second direction D2. Each of the cell active patterns ACT may be a protruding portion of the substrate 10, which protrudes along a fourth direction D4 perpendicular to the top surface of the substrate 10.

Device isolation layers 120 may be disposed on the cell center region CR, the cell middle region MR, and the cell edge region ER. The device isolation layers 120 may be disposed in the substrate 10 to define the cell active patterns ACT. The device isolation layers 120 may include or may be formed of, for example, one or more of silicon oxide, silicon nitride, and silicon oxynitride.

On the cell center region CR, the cell middle region MR, and the cell edge region ER, word lines WL may extend across the cell active patterns ACT and the device isolation layers 120. The word lines WL may be spaced apart from each other along the first direction D1 while extending in the second direction D2. The word lines WL may be buried within the substrate 10. Each of the word lines WL may include a gate electrode. The gate electrode may extend in the second direction D2 and may penetrate upper portions of the device isolation layers 120 and the cell active patterns ACT. The gate electrode may include or may be formed of a conductive material. For example, the conductive material may include or may be formed of one of doped semiconductor materials (doped silicon, doped germanium, etc.), conductive metal nitrides (titanium nitride, tantalum nitride, etc.), metals (tungsten, titanium, tantalum, etc.), and metal-semiconductor compounds (tungsten silicide, cobalt silicide, titanium silicide, etc.).

The cell active patterns ACT may be provided therein with impurity sections. The impurity sections may include first impurity sections 110a and second impurity sections 110b. The first impurity sections 110a may be provided between a pair of word lines WL that correspondingly extend across the cell active patterns ACT. The second impurity sections 110b may be provided on opposite edge areas of each of the cell active patterns ACT. The first impurity sections 110a may include impurities whose conductivity type is the same as that of the second impurity sections 110b.

Buffer patterns 305 may be disposed on the cell center region CR, the cell middle region MR, and the cell edge region ER. The buffer patterns 305 may cover the cell active patterns ACT and the device isolation layers 120. The buffer patterns 305 may include or may be formed of, for example, one or more of silicon oxide, silicon nitride, and silicon oxynitride.

Bit lines BL may be disposed on each cell block CB. The bit lines BL may be spaced apart from each other in the second direction D2 while extending along the first direction D1. The bit lines BL may each include a first ohmic pattern 331 and a metal-containing pattern 330 that are sequentially stacked. The first ohmic pattern 331 may include or may be formed of, for example, metal silicide. The metal-containing pattern 330 may include or may be formed of metal (e.g., tungsten, titanium, or tantalum).

The bit lines BL may be disposed on the cell center region CR, the cell middle region MR, and the cell edge region ER of each cell block CB. The bit lines BL may include center bit lines BLc on the cell center region CR, middle bit lines BLm on the cell middle region MR, and edge bit lines BLe on the cell edge region ER. The center bit lines BLc may be connected to the middle bit lines BLm, and the middle bit lines BLm may be connected to the edge bit lines BLe. The edge bit lines BLe may include ends of the bit lines BL.

Each of the bit lines BL may have a first lateral surface S1 and a second lateral surface S2 that are opposite to each other in the second direction D2. The first lateral surface S1 may straightly extend (i.e., without deviation in direction) along the first direction D1 on the cell center region CR, the cell middle region MR, and the cell edge region ER. The first lateral surface S1 may straightly extend on all portions of each bit line BL. The second lateral surface S2 may extend in the first direction D1, and may straightly extend on each of the cell center region CR and the cell edge region ER while having a profile in which the second lateral surface S2 changes on the cell middle region MR. For example, on the cell middle region MR, the second lateral surface S2 may extend in a direction that intersects the first direction D1 and the second direction D2. The second lateral surface S2 may continuously extend at a boundary between the cell middle region MR and the cell center region CR and a boundary between the cell middle region MR and the cell edge region ER. As a result of the change in profile of the second lateral surface S2 on the cell middle region, the width, in the second direction D2, of the edge bit line BLe differs from the width of the center bit line BLc.

The edge bit line BLe may have a width wBLe, in the second direction D2, greater than a width wBLc of the center bit line BLc. The middle bit line BLm may have a width wBLm, in the second direction D2, the same as or less than the width wBLe of the edge bit line BLe. The width wBLm of the middle bit line BLm, in the second direction D2, may be the same as or greater than the width wBLc of the center bit line BLc. The width wBLm of the middle bit line BLm, in the second direction D2, may increase with decreasing distance from the cell edge region ER. The width wBLm of the middle bit line BLm and the width wBLc of the center bit line BLc may be the same at a boundary between the cell middle region MR and the cell center region CR. The width wBLm of the middle bit line BLm and the width wBLe of the edge bit line BLe may be the same at a boundary between the cell middle region MR and the cell edge region ER.

The bit lines BL may include a first bit line BL1, a second bit line BL2, and a third bit line BL3 that are adjacent to each other. The first bit line BL1 may be an arbitrary one of the bit lines BL. Each of the second and third bit lines BL2 and BL3 may be one of the bit lines BL capable of being defined by the first bit line BL1. The first bit line BL1 may be interposed between the second bit line BL2 and the third bit line BL3, and thus may be disposed to be directly adjacent (i.e., without any other intervening bit lines) to the second bit line BL2 and the third bit line BL3. The first bit line BL1 and the second bit line BL2 may be disposed to allow their first lateral surfaces S1 to face each other. The first bit line BL1 and the third bit line BL3 may be disposed to allow their second lateral surfaces S2 to face each other.

Adjacent pairs of the bit lines BL1, BL2, and BL3 may have their lateral profiles that are symmetric about an axis parallel to the first direction D1. For example, the first bit line BL1 and the second bit line BL2 may have their lateral profiles that are symmetric about an axis parallel to the first direction D1, and the first bit line BL1 and the third bit line BL3 may have their lateral profiles that are symmetric about an axis parallel to the first direction D1. In this case, the second bit line BL2 and the third bit line BL3 may have the same lateral profile.

A distance between the second lateral surface S2 of the first bit line BL1 and the second lateral surface S2 of the third bit line BL3 on the cell edge region ER may be less than the distance between the second lateral surface S2 of the first bit line BL1 and the second lateral surface S2 of the third bit line BL3 on the cell center region CR. On the cell edge region ER, a distance between the second lateral surface S2 of the first bit line BL1 and the second lateral surface S2 of the third bit line BL3 may be less than a distance between the first lateral surface S1 of the first bit line BL1 and the first lateral surface S1 of the second bit line BL2.

Polysilicon patterns 310 may be interposed between the bit lines BL and the buffer pattern 305. Bit line capping patterns 350 may be disposed on corresponding bit lines BL. The bit line capping patterns 350 may be spaced apart from each other along the second direction D2 while extending along the first direction D1 on the bit lines BL.

Bit line contacts DC may be correspondingly interposed between the bit lines BL and the first impurity sections 110a. The bit lines BL may be electrically connected through the bit line contacts DC to the first impurity sections 110a. The bit line contacts DC may include or may be formed of impurity-doped polysilicon or impurity-undoped polysilicon.

The bit line contact DC may be disposed in a recess RE. The recess RE may be provided on an upper portion of the first impurity section 110a and its adjacent upper portion of the device isolation layer 120. A first buried dielectric pattern 314 and a second buried dielectric pattern 315 may fill an unoccupied portion of the recess RE.

Storage node contacts BC may be interposed between the bit lines BL. The storage node contacts BC may be spaced apart from each other in the first direction D1 and the second direction D2. The storage node contacts BC may include or may be formed of impurity-doped polysilicon or impurity-undoped polysilicon.

The storage node contacts BC may include first contacts BC1 and second contacts BC2. On the cell edge region ER, the first contacts BC1 of the storage node contacts BC may be interposed between the first lateral surface S1 of the first bit line BL1 and the first lateral surface S1 of the second bit line BL2. On the cell edge region ER, the second contacts BC2 of the storage node contacts BC may be interposed between the second lateral surface S2 of the first bit line BL1 and the second lateral surface S2 of the third bit line BL3. The second contact BC2 may have a width w2 less than a width w1 of the first contact BC1.

On the cell edge region ER, the first contacts BC1 may be adjacent to the second contacts BC2 in the second direction D2. For example, among the storage node contacts BC disposed along the second direction D2 on the cell edge region ER, odd-numbered storage node contacts BC may be the first contacts BC1. In this case, among the storage node contacts BC disposed along the second direction D2 on the cell edge region ER, even-numbered storage node contacts BC may be the second contacts BC2.

On the cell center region CR, the first contacts BC1 may further be interposed between the first lateral surface S1 of the first bit line BL1 and the first lateral surface S1 of the second bit line BL2 and between the second lateral surface S2 of the first bit line BL1 and the second lateral surface S2 of the third bit line BL3. The width w2 of the second contacts BC2 on the cell edge region ER may be less than the width w1 of the first contacts BC1 on the cell center region CR. The width w1 of the first contacts BC1 on the cell edge region ER may be substantially the same as the width w1 of the first contacts BC1 on the cell center region CR.

Bit line spacers SP may cover lateral surfaces of the polysilicon pattern 310, lateral surfaces of the bit lines BL, and lateral surfaces of the bit line capping patterns 350. The bit line spacers SP may be correspondingly interposed between the bit lines BL and the storage node contacts BC.

The bit line spacers SP may cover the first lateral surface S1 and the second lateral surface S2 of each of the bit lines BL. Each of the bit line spacers SP may have a profile that conforms to that of one of the first and second lateral surfaces S1 and S2 with which the bit line spacers SP are in contact. For example, one of the bit line spacers SP that is in contact with the first lateral surface S1 may straightly extend along the first direction D1 on the cell center region CR, the cell middle region MR, and the cell edge region ER. One of the bit line spacers SP that is in contact with the second lateral surface S2 may extend in the first direction D1, and may straightly extend on each of the cell center region CR and the cell edge region ER while having a profile in which the bit line spacer SP that is in contact with the second lateral surface S2 changes on the cell middle region MR. For example, on the cell middle region MR, the bit line spacer SP may extend in a direction that intersects the first direction D1 and the second direction D2.

The bit line spacer SP may have a width that is constant on the cell center region CR, the cell middle region MR, and the cell edge region ER and is constant on the first and second lateral surfaces S1 and S2 of the bit lines BL.

On the cell center region CR, there may be a constant distance between directly adjacent ones of the bit line spacers SP. For example, on the cell center region CR, a distance between the bit line spacers SP on the first lateral surfaces S1 that face each other may be substantially the same as the distance between the bit line spacers SP on the second lateral surfaces S2 that face each other.

On the cell edge region ER, a distance between the bit line spacers SP on the second lateral surfaces S2 that face each other may be less than the distance between the bit line spacers SP on the first lateral surfaces S1 that face each other. A distance between the bit line spacers SP on the second lateral surfaces S2 that face each other on the cell edge region ER may be less than the distance between the bit line spacers SP on the second lateral surfaces S2 that face each other on the cell center region CR.

The bit line spacers SP may include a first sub-spacer 321 and a second sub-spacer 325 that are spaced apart from each other across an air gap AG. The first sub-spacer 321 and the second sub-spacer 325 may each have a single-layered or multi-layered structure including at least one selected from a silicon nitride layer, a silicon oxide layer, and a silicon oxynitride layer. The first sub-spacer 321 and the second sub-spacer 325 may include or may be formed of the same material. The first sub-spacer 321 and the first buried dielectric pattern 314 may include or may be formed of the same material. The phrase "air gap" will be understood to include gaps (e.g., pockets) of air or gases other than air, such as other atmospheric gases or chamber gases that may be present during manufacturing. An "air gap" may also constitute a space having no or substantially no gas or other material therein.

A second ohmic pattern 341 may be disposed on each of the storage node contacts BC. The second ohmic pattern 341 may include or may be formed of metal silicide. A diffusion stop pattern 342 may conformally cover the first sub-spacer 321, the second sub-spacer 325, and the bit line capping pattern 350. The diffusion stop pattern 342 may include or may be formed of metal nitride, such as titanium nitride or tantalum nitride.

Landing pads LP may be disposed on the storage node contacts BC. The storage node contact BC, the second ohmic pattern 341, the diffusion stop pattern 342, and the landing pad LP may be sequentially stacked. The landing pads LP may include or may be formed of a material containing metal such as tungsten.

The landing pads LP may include first landing pads LP1 and second landing pads LP2. The first landing pads LP1 may be disposed on the first contacts BC1, and the second landing pads LP2 may be disposed on the second contacts BC2. The first landing pads LP1 may have their lower portions whose widths are greater than those of lower portions of the second landing pads LP2. The first landing pads LP1 may have their upper portions whose widths are substantially the same as those of upper portions of the second landing pads LP2.

The landing pads LP may have an upper portion whose width is greater than that of an upper portion of the storage node contact BC. The upper portion of the landing pads LP may be shifted in the second direction D2 from the storage node contact BC. The landing pads LP may be spaced apart from each other in the first direction D1 and the second direction D2.

An interlayer dielectric pattern 400 may be provided between adjacent landing pads LP. The interlayer dielectric pattern 400 may be in contact with an upper portion of the bit line capping pattern 350, an upper portion of the bit line spacer SP, lateral surfaces of the landing pads LP, and the diffusion stop pattern 342 not covered with the landing pads LP. The interlayer dielectric pattern 400 may include or may be formed of, for example, one or more of a silicon oxide layer, a silicon nitride layer, and a silicon oxynitride layer. Alternatively, the interlayer dielectric pattern 400 may further include an air-filled space that is spatially connected to the air gap AG of the bit line spacer SP.

Bottom electrodes BE may be disposed on corresponding landing pads LP. The bottom electrodes BE may include or may be formed of at least one selected from a metal nitride layer, such as an impurity-doped polysilicon layer or a titanium nitride layer, and a metal layer, such as a tungsten layer, an aluminum layer, or a copper layer. Each of the bottom electrodes BE may have a circular pillar shape, a hollow cylindrical shape, or a cup shape. An upper support pattern SS1 may support upper sidewalls of the bottom electrodes BE, and a lower support pattern SS2 may support lower sidewalls of the bottom electrodes BE. The upper and lower support patterns SS1 and SS2 may include or may be formed of a dielectric material, such as silicon nitride, silicon oxide, or silicon oxynitride.

An etch stop layer 420 may be provided on the interlayer dielectric pattern 400. At least a portion of the etch stop layer 420 may be provided between the bottom electrodes BE. The etch stop layer 420 may include or may be formed of a dielectric material, such as silicon nitride, silicon oxide, or silicon oxynitride. A dielectric layer DL may cover surfaces of the bottom electrodes BE and surfaces of the upper and lower support patterns SS1 and SS2. The dielectric layer DL may include or may be formed of, for example, at least one selected from a silicon oxide layer, a silicon nitride layer, a silicon oxynitride layer, and a high-k dielectric layer (e.g., hafnium oxide layer). A top electrode TE may be disposed on the dielectric layer DL and may fill a space between the bottom electrodes BE. The top electrode TE may include or may be formed of at least one selected from an impurity-doped polysilicon layer, an impurity-doped silicon-germanium layer, a metal nitride layer such as a titanium nitride layer, and a metal layer such as a tungsten layer, an aluminum layer, or a copper layer. The bottom electrodes BE, the dielectric layer DL, and the top electrode TE may constitute a capacitor CA.

FIGS. 4, 6, 8, and 10 illustrate plan views of section P1 depicted in FIG. 1, showing a method of fabricating a semiconductor device according to some embodiments of the present inventive concepts. FIGS. 5, 7, 9, and 11 illustrate cross-sectional views taken along lines A-A' and B-B' of FIGS. 4, 6, 8, and 10, respectively. The following will describe a method of fabricating a semiconductor device according to some embodiments of the present inventive concepts. The repetitive explanation with reference to FIGS. 1 to 3 will be omitted in the interest of brevity of description.

Figure 4:
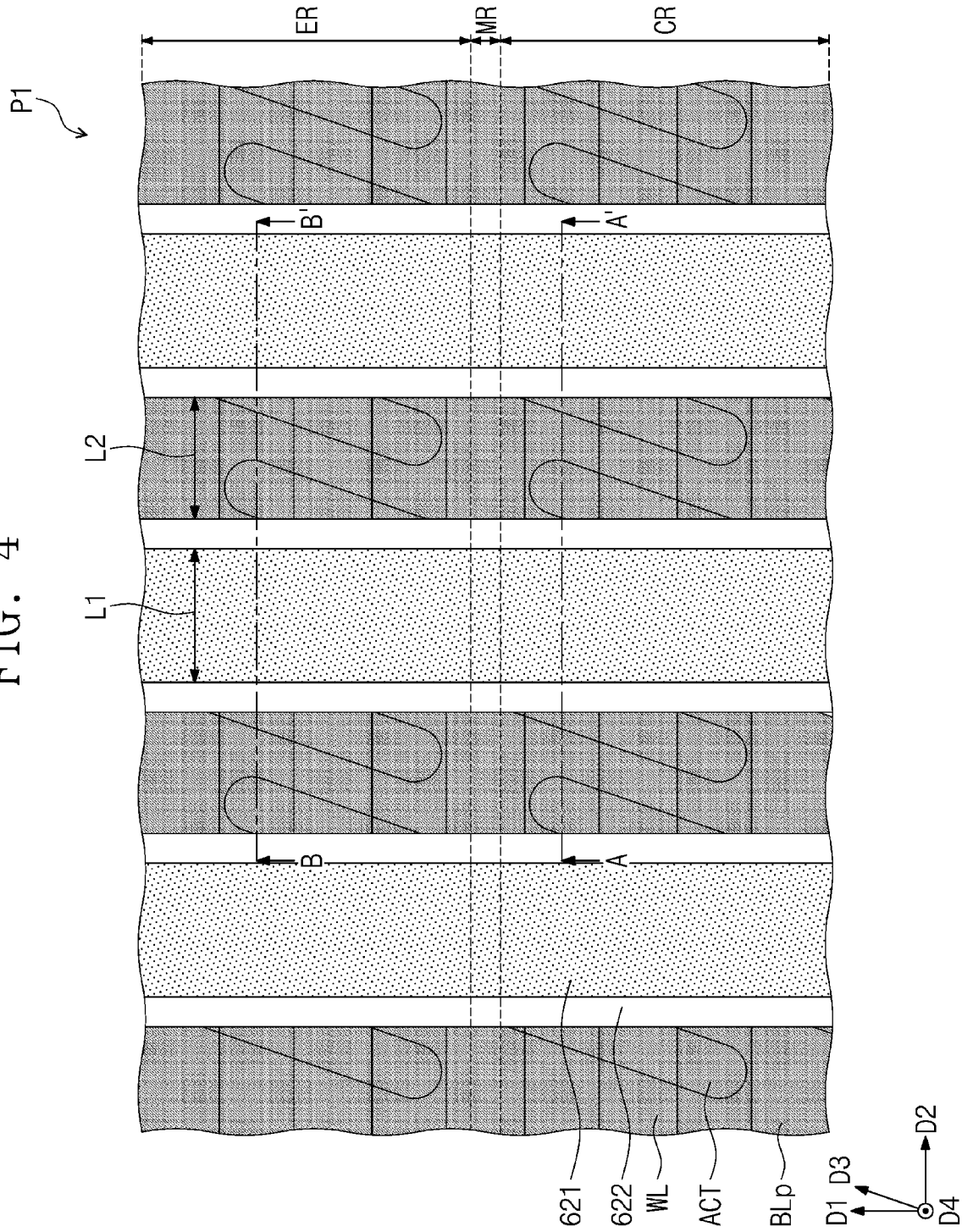
FIGS. 4, 6, 8, and 10 illustrate plan views of section P1 depicted in FIG. 1, showing a method of fabricating a semiconductor device according to some embodiments of the present inventive concepts.
Figure 5:
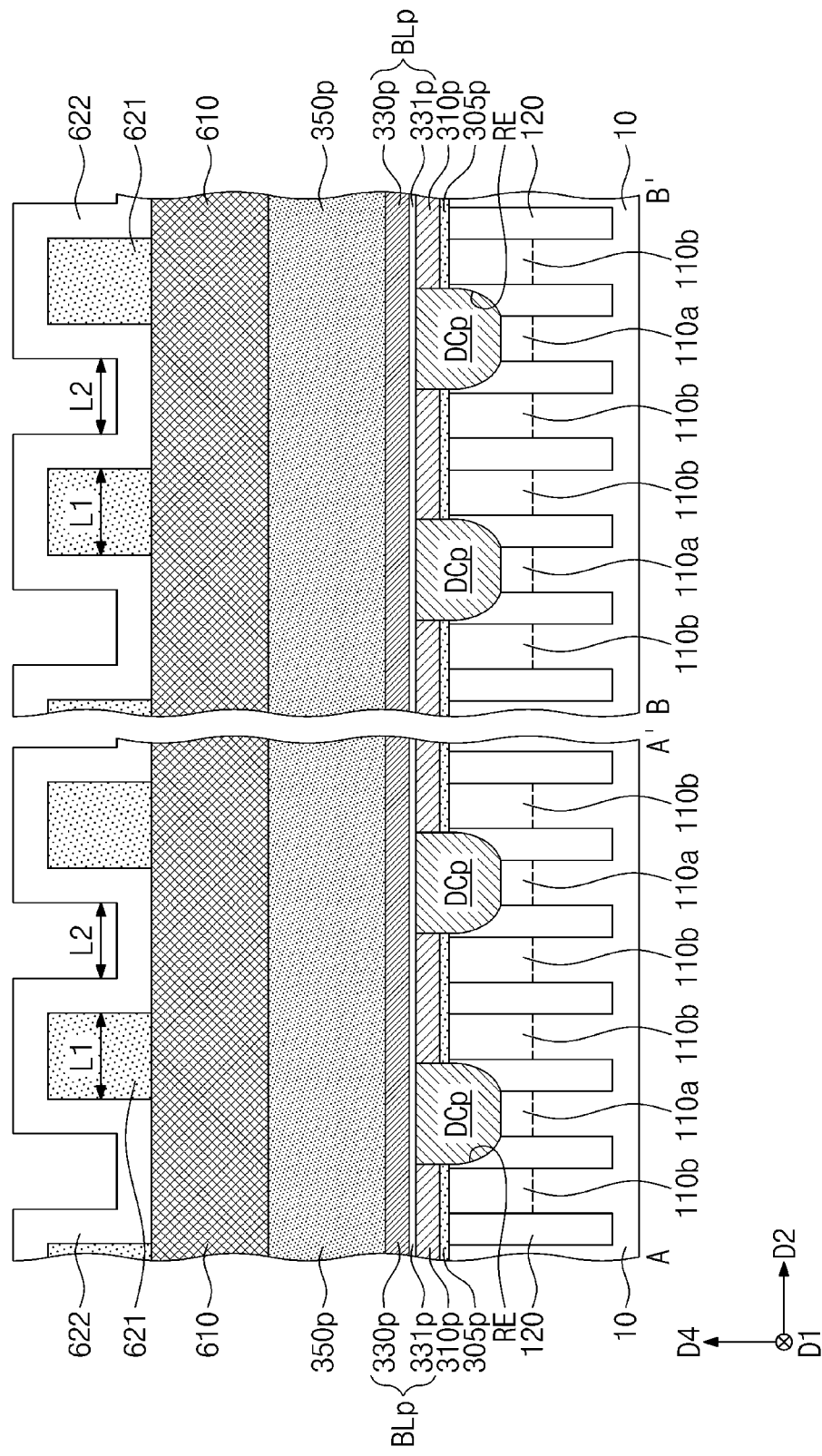
FIGS. 5, 7, 9, and 11 illustrate cross-sectional views taken along lines A-A' and B-B' of FIGS. 4, 6, 8, and 10, respectively.

Referring to FIGS. 4 to 5, a substrate 10 may be prepared which includes the cell blocks CB of FIG. 1 and the peripheral block PB of FIG. 1. Each of the cell blocks CB may include a cell center region CR, a cell edge region ER, and a cell middle region MR between the cell center region CR and the cell edge region ER.

Cell active patterns ACT and device isolation layers 120 may be formed in/on the substrate 10 on the cell center region CR, the cell middle region MR, and the cell edge region ER. The cell active patterns ACT may be spaced apart from each other along a first direction D1 parallel to a top surface of the substrate 10 and along a second direction D2 that is parallel to the top surface of the substrate 10 and intersects the first direction D1. The cell active patterns ACT may each have a bar shape that is parallel to the top surface of the substrate 10 and extends in a third direction D3 intersecting the first and second directions D1 and D2. The device isolation layers 120 may be disposed in/on the substrate 10 to define the cell active patterns ACT.

Word lines WL may be formed to extend across the cell active patterns ACT and the device isolation layers 120 on the cell center region CR, the cell middle region MR, and the center edge region ER. The word lines WL may be spaced apart from each other along the first direction D1 while extending in the second direction D2. The word lines WL may be buried within the substrate 10.

Impurity sections may be formed in the cell active patterns ACT, and may include first impurity sections 110a and second impurity sections 110b. The first impurity sections 110a may be formed between a pair of word lines WL that correspondingly run across the cell active patterns ACT. The second impurity sections 110b may be formed on opposite edge areas of each of the cell active patterns ACT.

Preliminary buffer patterns 305p and preliminary polysilicon patterns 310p may be formed on the substrate 10. The formation of the preliminary buffer patterns 305p and the preliminary polysilicon patterns 310p may include sequentially stacking a buffer layer and a polysilicon layer and forming recesses RE. In an etching process for forming the recesses RE, the buffer layer and the polysilicon layer may be respectively formed into the preliminary buffer patterns 305p and the preliminary polysilicon patterns 310p. The recesses RE may be formed by etching the buffer layer, the polysilicon layer, upper portions of the first impurity sections 110a, and upper portions of the device isolation layers 120. The recesses RE may be formed on upper portions of the first impurity sections 110a and upper portions of the device isolation layers 120. Afterwards, preliminary bit line contacts DCp may fill the recesses RE.

A bit line layer BLp, a bit line capping layer 350p, a lower mask layer 610, upper mask patterns 621, and a sacrificial layer 622 may be formed on the substrate 10.

The formation of the bit line layer BLp, the bit line capping layer 350p, the lower mask layer 610, the upper mask patterns 621, and the sacrificial layer 622 may include sequentially stacking the bit line layer BLp, the bit line capping layer 350p, the lower mask layer 610, an upper mask layer, and a first photoresist layer on the preliminary polysilicon patterns 310p and the preliminary bit line contacts DCp, photolithographically exposing the upper mask layer, etching the upper mask layer along the exposed pattern to form the upper mask patterns 621, and allowing the sacrificial layer 622 to cover the upper mask patterns 621. The bit line layer BLp, the bit line capping layer 350p, the lower mask layer 610, the upper mask layer may be formed by one or more of physical vapor deposition, chemical vapor deposition, and atomic layer deposition. The sacrificial layer 622 may be formed by one or more of chemical vapor deposition and atomic layer deposition.

The bit line layer BLp may include an ohmic layer 331p and a metal-containing layer 330p, and may have a structure in which the ohmic layer 331p and the metal-containing layer 330p are sequentially stacked. Afterwards, the bit line capping layer 350p may be formed on the bit line layer BLp. The bit line capping layer 350p may include silicon nitride. The lower mask layer 610 may include an amorphous carbon layer (ACL). The upper mask patterns 621 may include a spin-on-hardmask (SOH) layer. The upper mask patterns 621 may extend along the first direction D1 and may be spaced apart from each other along the second direction D2. The sacrificial layer 622 may include silicon oxide.

The sacrificial layer 622 may cover top surfaces of the upper mask patterns 621, lateral surfaces of the upper mask patterns 621, and a top surface of the lower mask layer 610 exposed by the upper mask patterns 621. The upper mask patterns 621 may each have a width L1 in the second direction D2 greater than a width L2 between portions of the sacrificial layer 622 that cover the lateral surfaces of the upper mask patterns 621.

Figure 6:
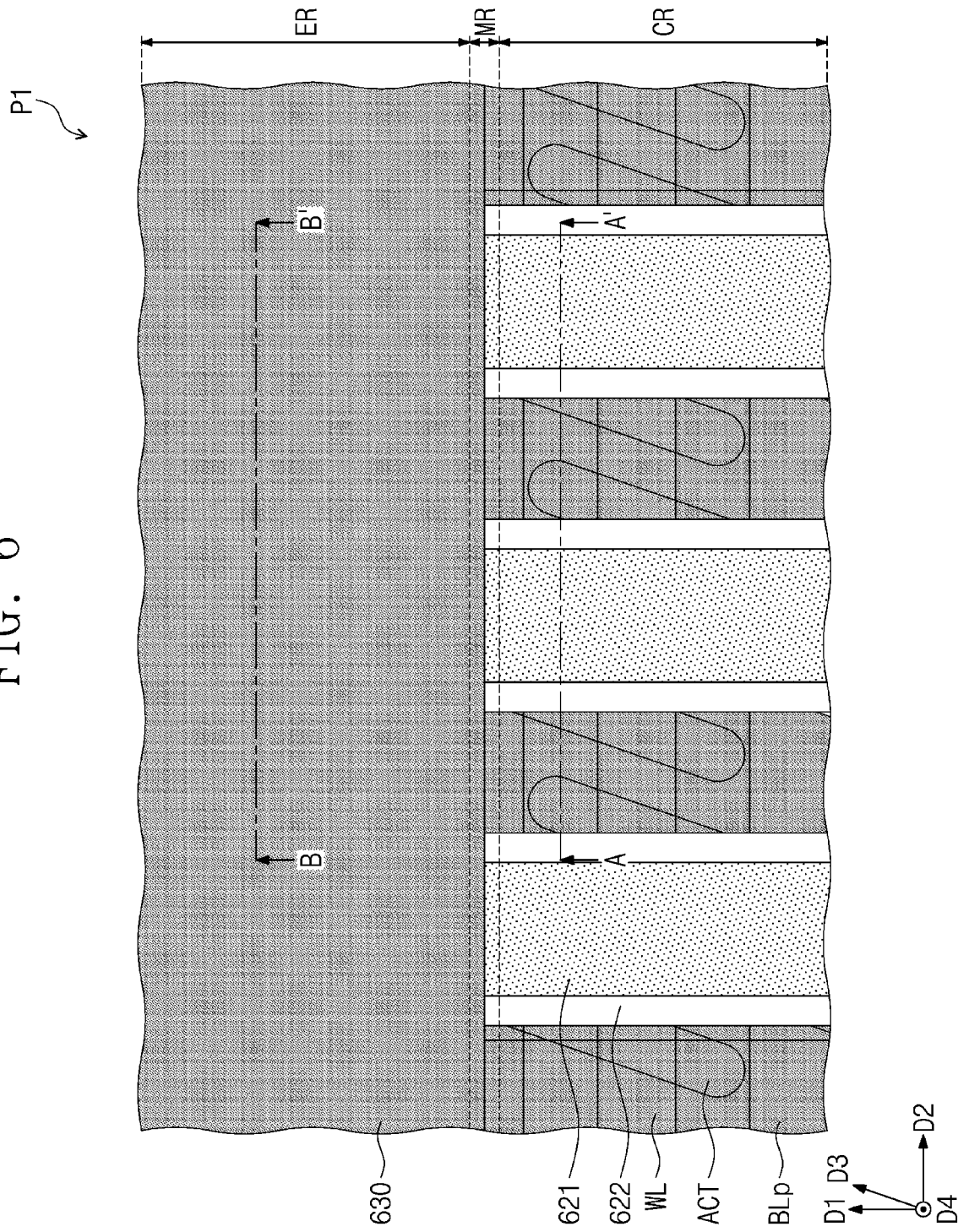
Figure 7:
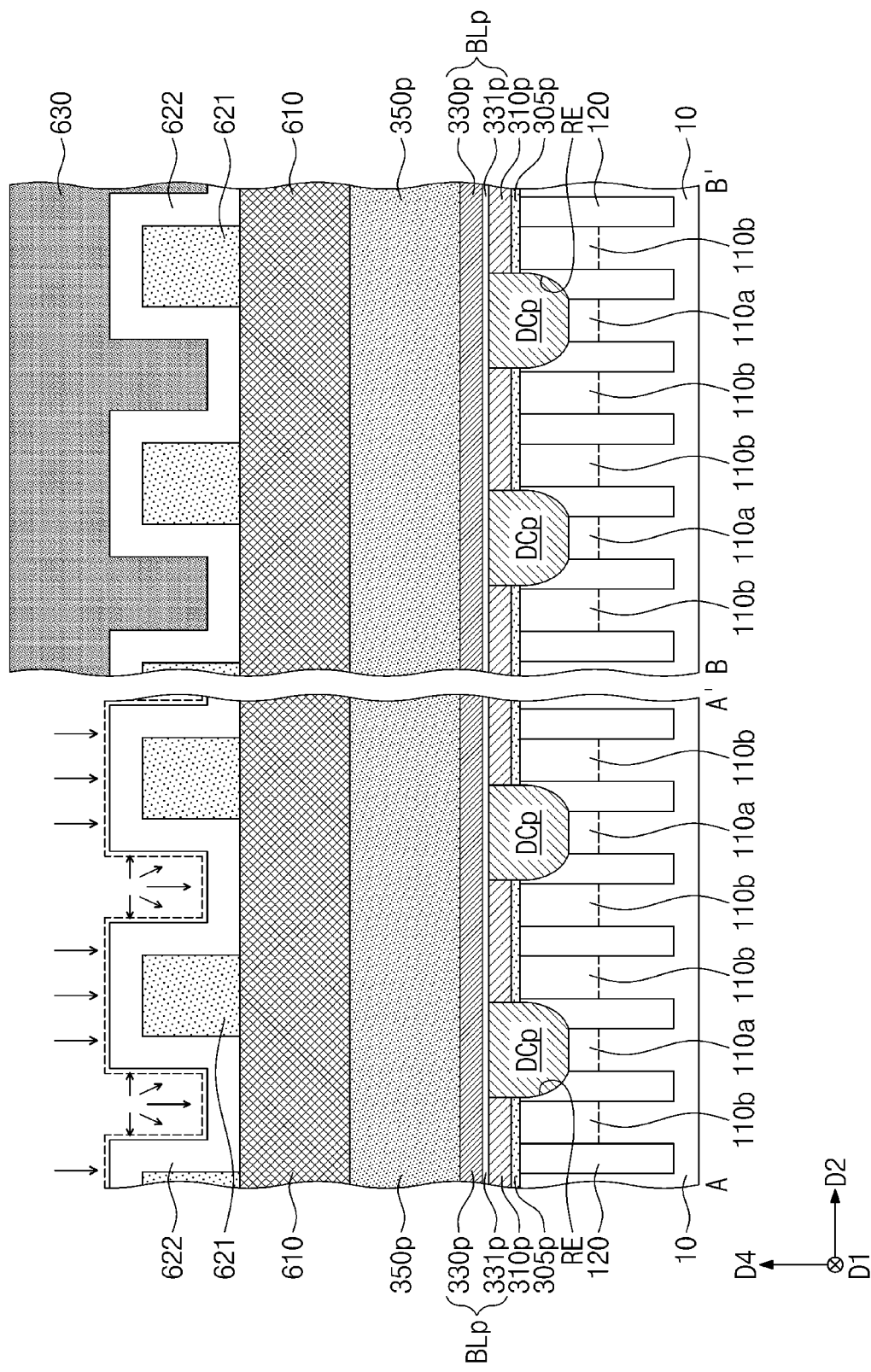

Referring to FIGS. 6 and 7, photoresist patterns 630 may be formed on the sacrificial layer 622, covering the cell edge region ER and a portion of the cell middle region MR adjacent to the cell edge region ER. The formation of the photoresist patterns 630 may include forming a second photoresist layer to cover the sacrificial layer 622 and photolithographically exposing the second photoresist layer. The exposure may convert the second photoresist layer into the photoresist patterns 630.

A removal may be performed on a portion of the sacrificial layer 622 exposed by the photoresist patterns 630. The removal of the portion of the exposed sacrificial layer 622 may include etching the exposed sacrificial layer 622. For example, the removal of the portion of the sacrificial layer 622 exposed by the photoresist patterns 630 may include isotropically etching the portion of the exposed sacrificial layer 622. The exposed sacrificial layer 622 may include the sacrificial layer 622 on an area not covered with the photoresist patterns 630. For example, the exposed sacrificial layer 622 may include the sacrificial layer 622 on the cell center region CR and a portion of the cell middle region MR adjacent to the cell center region CR.

The removal of the portion of the exposed sacrificial layer 622 may reduce a thickness of the exposed sacrificial layer 622 that partially covers the upper mask patterns 621. The thickness of the exposed sacrificial layer 622 may be less than that of the sacrificial layer 622 on an area covered with the photoresist patterns 630.

A thickness of the sacrificial layer 622 on the cell center region CR may be less than that of the sacrificial layer 622 on the cell edge region ER. An etching amount of the sacrificial layer 622 on the cell middle region MR may increase with decreasing distance from the cell center region CR. For example, a thickness of the sacrificial layer 622 on the cell middle region MR may decrease with decreasing distance from the cell center region CR.

Figure 8:
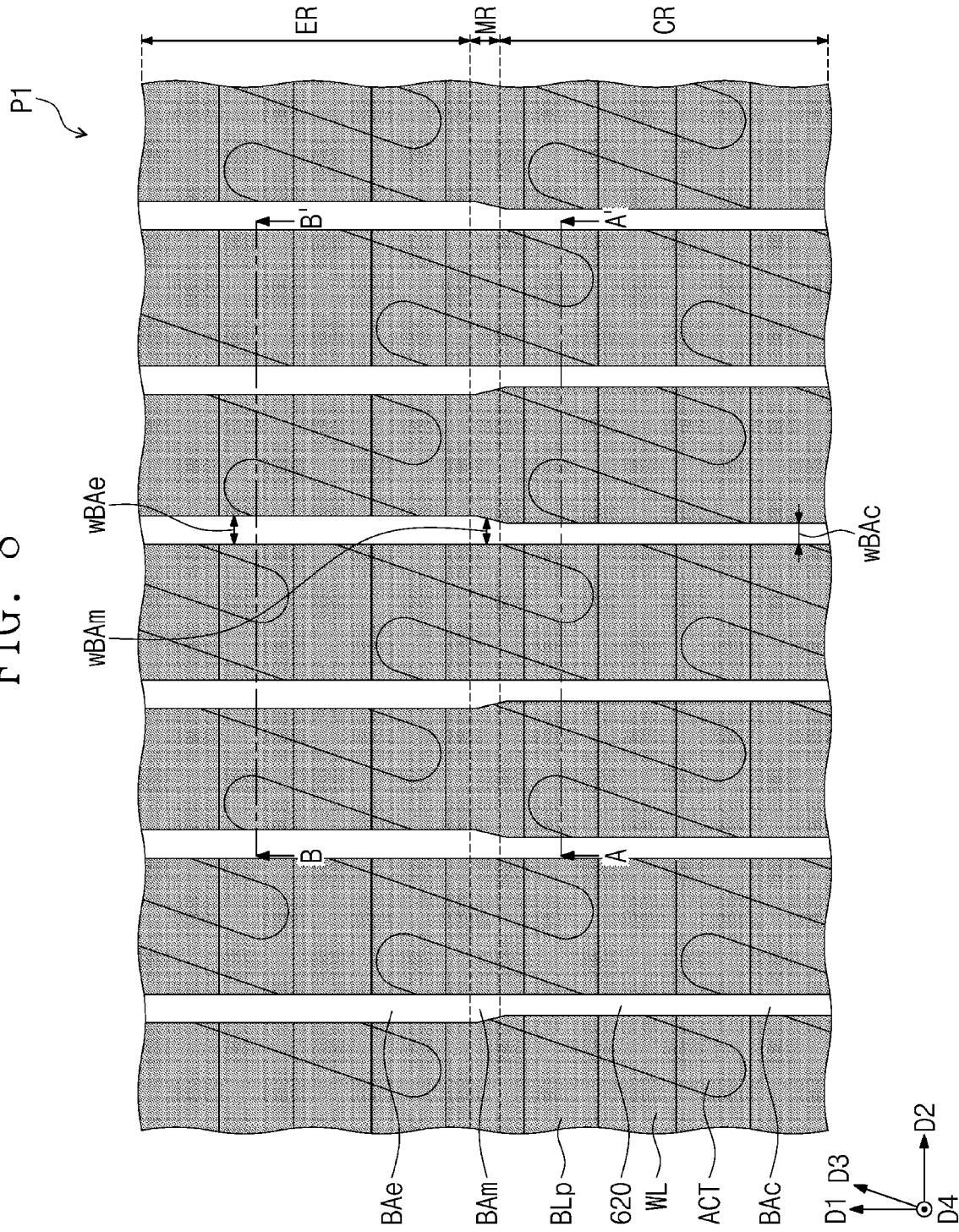
Figure 9:
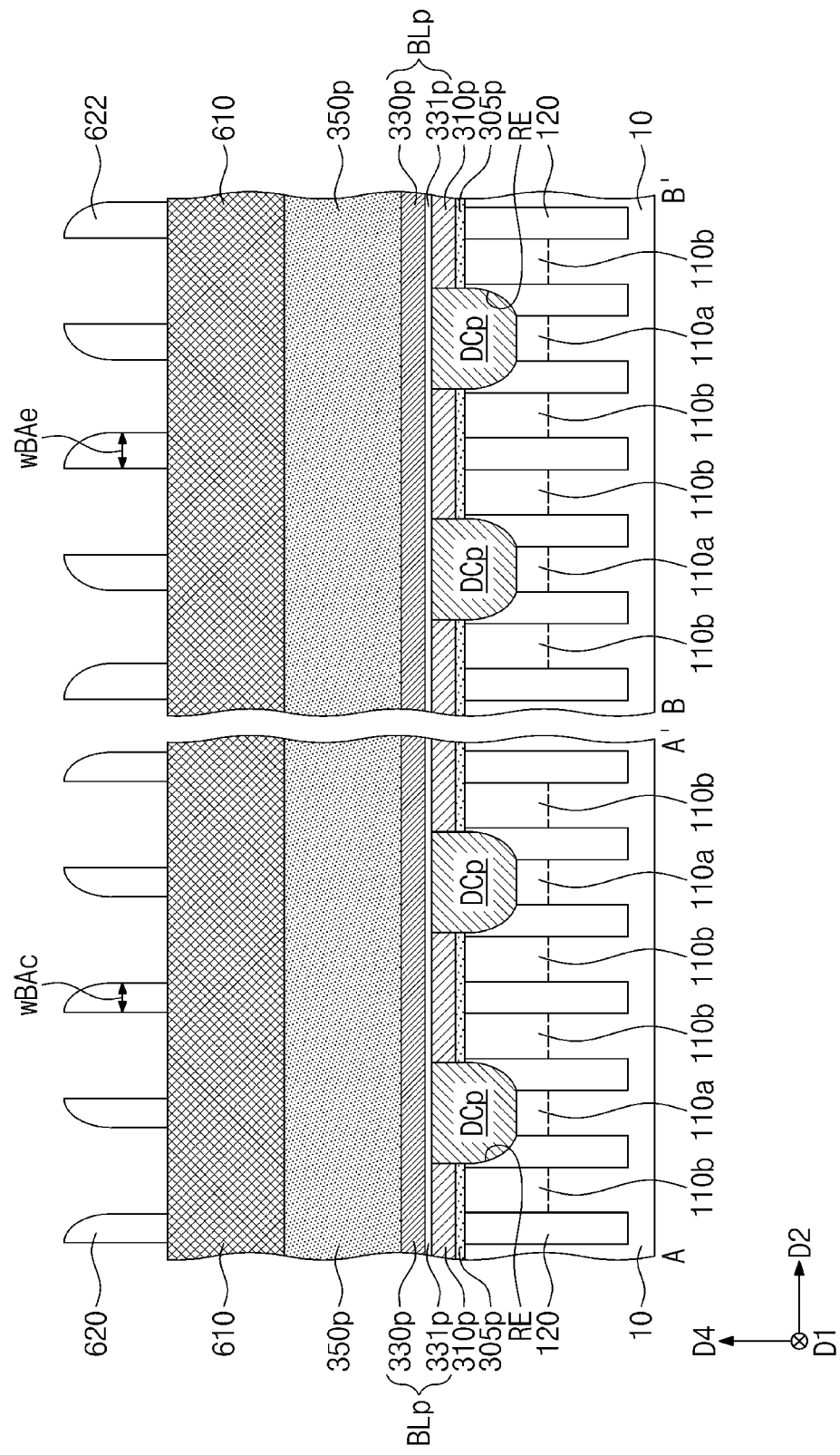

Referring to FIGS. 8 and 9, the photoresist patterns 630 may be removed. The removal of the photoresist patterns 630 may include performing an ashing process and/or a strip process. Afterwards, the sacrificial layer 622 may be formed into sacrificial patterns 620. The formation of the sacrificial patterns 620 may include etching a portion of the sacrificial layer 622 that covers the top surface of the lower mask layer 610 and the top surfaces of the upper mask patterns 621. The sacrificial patterns 620 may include the sacrificial layer 622 that are not etched. For example, the sacrificial patterns 620 may include the sacrificial layer 622 that covers the lateral surfaces of the upper mask patterns 621.

The formation of the sacrificial patterns 620 may further include removing the upper mask patterns 621 exposed by etching the sacrificial layer 622 that covers the top surfaces of the upper mask patterns 621. The removal of the upper mask patterns 621 may include performing an ashing process and/or a strip process.

The sacrificial patterns 620 may be disposed on the cell center region CR, the cell middle region MR, and the cell edge region ER of the cell blocks CB. The sacrificial patterns 620 may extend along the first direction D1 and may be spaced apart from each other along the second direction D2. The sacrificial patterns 620 may include center sacrificial patterns BAc on the cell center region CR, middle sacrificial patterns BAm on the cell middle region MR, and edge sacrificial patterns BAe on the cell edge region ER. The center sacrificial patterns BAc may be connected to the middle sacrificial patterns BAm, and the middle sacrificial patterns BAm may be connected to the edge sacrificial patterns BAe.

The center sacrificial patterns BAc may be formed from the sacrificial layer 622 on the cell center region CR. The middle sacrificial patterns BAm may be formed from the sacrificial layer 622 on the cell middle region MR. The edge sacrificial patterns BAe may be formed from the sacrificial layer 622 on the cell edge region ER. Therefore, the sacrificial patterns BAc, BAm, and BAe on the cell center region CR, the cell middle region MR, and the cell edge region ER may have their widths wBAc, wBAm, and wBAe that are in proportion to thickness of the sacrificial layer 622.

The width wBAe of the edge sacrificial patterns BAe may be greater than the width wBAc of the center sacrificial patterns BAc. The width wBAm of each of the middle sacrificial patterns BAm may increase with decreasing distance from the cell edge region ER.

The middle sacrificial pattern BAm may have one lateral surface that corresponds to a lateral surface of the sacrificial layer 622 exposed when the sacrificial layer 622 is partially removed in the etching process of FIG. 7. The middle sacrificial pattern BAm may have another lateral surface that corresponds to a lateral surface of the sacrificial layer 622 exposed when the upper mask patterns 621 are removed. In the etching process of FIG. 7 on the cell middle region MR, the middle sacrificial pattern BAm may be formed to have a profile in which a distance between the one lateral surface and the straight-line-shaped another lateral surface gradually increases in the first direction D1.

Figure 10:
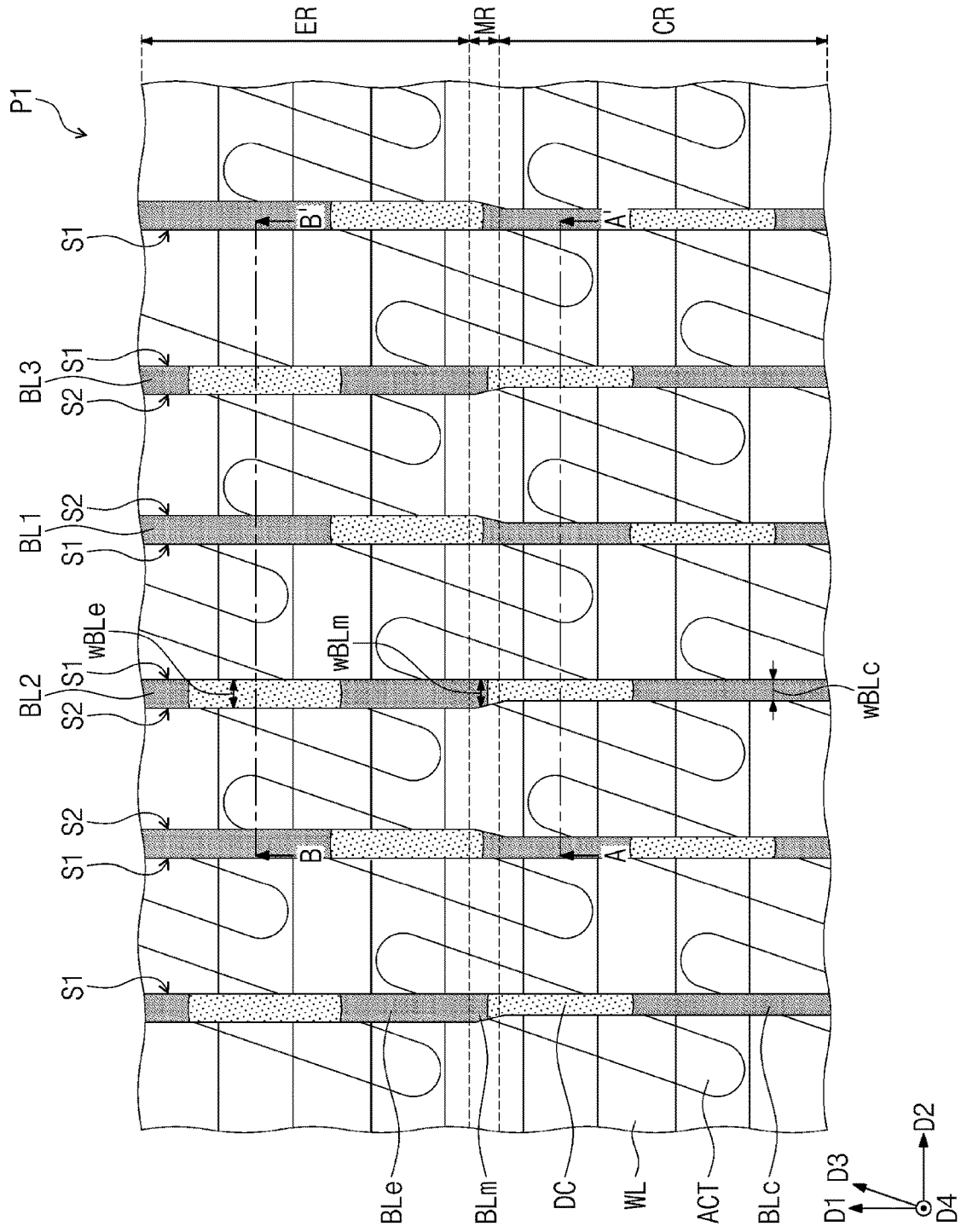
Figure 11:
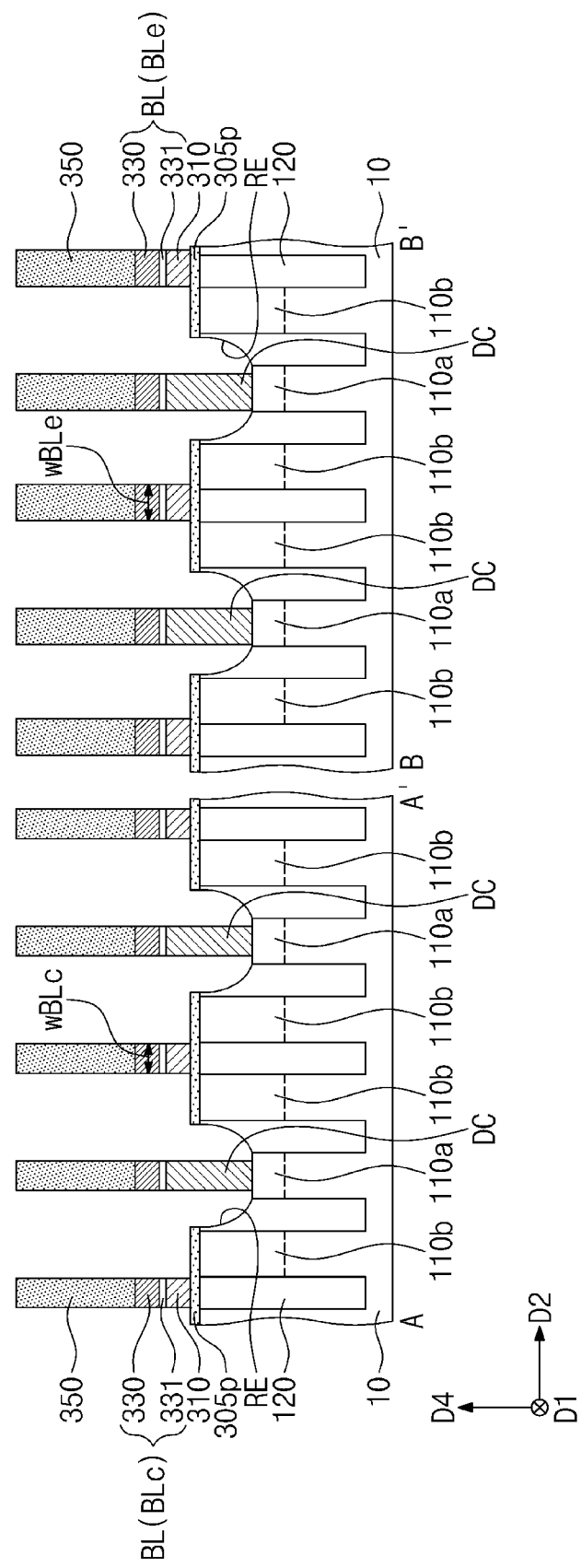

Referring to FIGS. 10 and 11, an etching process may be performed in which the sacrificial pattern 620 is used as an etching mask to etch the bit line layer BLp to form bit lines BL. The etching process may further form bit line capping patterns 350, polysilicon patterns 310, and bit line contacts DC.

The bit lines BL may include center bit lines BLc on the cell center region CR, middle bit lines BLm on the cell middle region MR, and edge bit lines BLe on the cell edge region ER. The edge bit lines BLe may each have a width wBLe greater than a width wBLc of each of the center bit lines BLc. The width wBLm of each of the middle bit lines BLm may increase with decreasing distance from the cell edge region ER.

Each of the bit lines BL may have a first lateral surface S1 and a second lateral surface S2 that are opposite to each other in the second direction D2. The first lateral surface S1 may straightly extend along the first direction D1 on the cell center region CR, the cell middle region MR, and the cell edge region ER. The second lateral surface S2 may extend in the first direction D1, and may straightly extend on each of the cell center region CR and the cell edge region ER while having a profile in which the second lateral surface S2 changes on the cell middle region MR. For example, on the cell middle region MR, the second lateral surface S2 may extend in a direction that intersects the first direction D1 and the second direction D2. The second lateral surface S2 may continuously extend at a boundary between the cell middle region MR and the cell center region CR and a boundary between the cell middle region MR and the cell edge region ER.

The bit lines BL may include a first bit line BL1, a second bit line BL2, and a third bit line BL3 that adjacent to each other. The first bit line BL1 may be an arbitrary one of the bit lines BL. Each of the second and third bit lines BL2 and BL3 may be one of the bit lines BL capable of being defined by the first bit line BL1. The first bit line BL1 may be disposed to interpose between and adjacent to the second bit line BL2 and the third bit line BL3. The first bit line BL1 and the second bit line BL2 may be disposed to allow their first lateral surfaces S1 to face each other. The first bit line BL1 and the third bit line BL3 may be disposed to allow their second lateral surfaces S2 to face each other.

A distance between the second lateral surface S2 of the first bit line BL1 and the second lateral surface S2 of the third bit line BL3 may be less on the cell edge region ER than on the cell center region CR. On the cell edge region ER, a distance between the second lateral surface S2 of the first bit line BL1 and the second lateral surface S2 of the third bit line BL3 may be less than a distance between the first lateral surface S1 of the first bit line BL1 and the first lateral surface S1 of the second bit line BL2.

Referring back to FIGS. 2 and 3, bit line spacers SP may be formed to cover lateral surfaces of the polysilicon patterns 310, lateral surfaces of the bit lines BL, and lateral surfaces of the bit line capping patterns 350. The bit line spacers SP may be formed to cover the first and second lateral surfaces S1 and S2 of the bit lines BL. Each of the bit line spacers SP may have a profile that conforms to that of one of the first and second lateral surfaces S1 and S2 with which the bit line spacers SP are in contact.

Storage node contacts BC may be formed to interpose between the bit lines BL. The storage node contacts BC may be formed between a pair of adjacent bit lines BL. The storage node contacts BC may be spaced apart from each other in the first direction D1 and the second direction D2. Each of the storage node contacts BC may be electrically connected to a corresponding one of the second impurity sections 110*b*. During the formation of the storage node contacts BC, the preliminary buffer patterns 305*p* of FIG. 11 may be partially etched to form buffer patterns 305.

A second ohmic pattern 341 may be formed on each of the storage node contacts BC. A diffusion stop pattern 342 may be formed to conformally cover the second ohmic pattern 341, the bit line spacer SP, and the bit line capping pattern 350.

Landing pads LP may be formed on the diffusion stop pattern 342. Each of the landing pads LP may be electrically connected to a corresponding one of the storage node contacts BC. An upper portion of the landing pad LP may be shifted in the second direction D2 from the corresponding storage node contact BC.

An interlayer dielectric pattern 400 may be formed between adjacent landing pads LP. The interlayer dielectric pattern 400 may be in contact with an upper portion of the bit line capping pattern 350, an upper portion of the bit line spacer SP, lateral surfaces of the landing pads LP, and the diffusion stop pattern 342 not covered with the landing pads LP.

Bottom electrodes BE may be correspondingly formed on the landing pads LP. An etch stop layer 420 may be formed on the interlayer dielectric pattern 400. An upper support pattern SS1 may be formed on upper sidewalls of the bottom electrodes BE, and a lower support pattern SS2 may be formed on lower sidewalls of the bottom electrodes BE. A dielectric layer DL may be formed to cover surfaces of the bottom electrodes BE and surfaces of the upper and lower support patterns SS1 and SS2, and a top electrode TE may be formed on the dielectric layer DL to fill a space between the bottom electrodes BE. The bottom electrodes BE, the dielectric layer DL, and the top electrode TE may constitute a capacitor CA.

In an etching process for forming the bit lines BL, when the bit lines BL are exposed to silicon oxide, the bit lines BL may not be satisfactorily passivated. Therefore, the bit lines BL may be over-etched to reduce widths of the bit lines BL. Although not shown, silicon oxide on the peripheral block PB of FIG. 1 may be exposed to an etching process for forming the bit lines BL, which may result in a reduction in widths wBLe of the edge bit lines BLe adjacent to the peripheral block PB. For these reasons, the bit lines BL may increase in resistance, and contact defects may be produced between the bit lines BL and bit line contact plugs through which electrical signals are transferred to the bit lines BL.

According to the present inventive concepts, in an etching process for forming the bit lines BL, a portion of the sacrificial layer 622 may be etched on the cell center region CR and the cell middle region MR adjacent to the cell center region CR. For example, the center sacrificial patterns BAc may be formed from the sacrificial layer 622 whose portion is etched on the cell center region CR, and thus the width wBAc of each of the center sacrificial patterns BAc may become less than the width wBAe of each of the edge sacrificial patterns BAe. Therefore, the width wBLc of each of the center bit lines BLc formed by using the center sacrificial patterns BAc as an etching mask may be less than the width wBLe of each of the edge bit lines BLe formed by using the edge sacrificial patterns BAe as an etching mask. In this case, even when the edge bit lines BLe are relatively over-etched, it may be possible to prevent the reduction in width wBLe of each of the edge bit lines BLe. As a result, semiconductor devices may have improved electrical properties and increased reliability.

According to the present inventive concepts, a width of each of bit lines may be greater on a cell edge region than on a cell center region of cell blocks. For example, it may be possible to minimize or reduce a reduction in width at an end of each of the bit lines. Therefore, the bit lines may decrease in resistance, and contact defects may be prevented between the bit lines and bit line contact plugs. As a result, semiconductor devices may have improved electrical properties and increased reliability. In addition, adjustment of widths of the bit lines on the cell edge region may be easily accomplished to facilitate miniaturization of semiconductor devices.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A semiconductor device, comprising:
   a substrate that includes a plurality of cell blocks and a peripheral block, each cell block including a cell center region, a cell edge region, and a cell middle region between the cell center region and the cell edge region; and
   a plurality of bit lines that extend along a first direction on each cell block, the first direction being parallel to a top surface of the substrate,
   wherein the bit lines include a plurality of center bit lines on the cell center region, a plurality of middle bit lines on the cell middle region, and a plurality of edge bit lines on the cell edge region,
   wherein each of the bit lines has a first lateral surface and a second lateral surface that are opposite to each other in a second direction, the second direction being parallel to the top surface of the substrate and intersecting the first direction,
   wherein the first lateral surface straightly extends along the first direction on the cell center region, the cell middle region, and the cell edge region, and
   wherein the second lateral surface straightly extends along the first direction on each of the cell center region and the cell edge region, and the second lateral surface extends along a third direction, that intersects the first direction and the second direction, on the cell middle region.

2. The semiconductor device of claim 1, wherein, in the second direction, a width of an edge bit line is greater than a width of a center bit line.

3. The semiconductor device of claim 1, wherein, in the second direction, a width of a middle bit line increases with decreasing distance from the cell edge region.

4. The semiconductor device of claim 3, wherein
   in the second direction, the width of the middle bit line and a width of a center bit line are the same at a boundary between the cell middle region and the cell center region, and
   in the second direction, the width of the middle bit line and a width of an edge bit line are the same at a boundary between the cell middle region and the cell edge region.

5. The semiconductor device of claim 1, wherein the first lateral surface of a bit line has a straight line shape along the first direction on all portions of the bit line.

6. The semiconductor device of claim 1, wherein the bit lines further include a first bit line, a second bit line, and a third bit line that are adjacent to each other,
   wherein the first bit line and the second bit line are disposed to allow a first lateral surface of the first bit line to face a first lateral surface of the second bit line, and
   wherein the first bit line and the third bit line are disposed to allow a second lateral surface of the first bit line to face a second lateral surface of the third bit line.

7. The semiconductor device of claim 6, wherein a distance between the second lateral surface of the first bit line and the second lateral surface of the third bit line is less on the cell edge region than on the cell center region.

8. The semiconductor device of claim 6, further comprising a plurality of storage node contacts between the bit lines,
   wherein, on the cell edge region, a plurality of first contacts among the storage node contacts are between the first lateral surface of the first bit line and the first lateral surface of the second bit line,
   wherein, on the cell edge region, a plurality of second contacts among the storage node contacts are between the second lateral surface of the first bit line and the second lateral surface of the third bit line, and
   wherein, in the second direction, a width of the second contact is less than a width of the first contact.

9. The semiconductor device of claim 8, wherein, on the cell edge region, the first contacts are adjacent to the second contacts in the second direction.

10. The semiconductor device of claim 8, wherein, on the cell center region, the first contacts are between the first lateral surface of the first bit line and the first lateral surface of the second bit line, and between the second lateral surface of the first bit line and the second lateral surface of the third bit line.

11. The semiconductor device of claim 8, further comprising a plurality of landing pads on the storage node contacts,
   wherein the landing pads include a plurality of first landing pads on the first contacts and a plurality of second landing pads on the second contacts, and
   wherein, in the second direction, a width at a lower portion of the first landing pad is greater than a width at a lower portion of the second landing pad.

12. The semiconductor device of claim 6, further comprising a plurality of bit line spacers that cover the first lateral surface and the second lateral surface of each of the bit lines,
 wherein each of the bit line spacers has a profile that conforms to a profile of one of the first and second lateral surfaces with which the bit line spacers are in contact with.

13. The semiconductor device of claim 12, wherein, in the second direction, a width of the bit line spacer is constant on the cell center region, the cell middle region, and the cell edge region.

14. The semiconductor device of claim 12, wherein a distance between adjacent ones of the bit line spacers is constant on the cell center region.

15. The semiconductor device of claim 12, wherein, on the cell edge region, a distance between the bit line spacers on the second lateral surfaces that face each other is less than a distance between the bit line spacers on the first lateral surfaces that face each other.

\* \* \* \* \*